United States Patent [19]
Horwitz

[11] Patent Number: 5,325,261
[45] Date of Patent: Jun. 28, 1994

[54] ELECTROSTATIC CHUCK WITH IMPROVED RELEASE

[75] Inventor: Christopher M. Horwitz, New South Wales, Australia

[73] Assignee: Unisearch Limited, Kensington, Australia

[21] Appl. No.: 843,764

[22] Filed: Mar. 2, 1992

[30] Foreign Application Priority Data

May 17, 1991 [AU] Australia .................. PK6211

[51] Int. Cl.$^5$ ............................................ H02N 13/00
[52] U.S. Cl. ............................ 361/234; 361/230; 361/233; 361/235
[58] Field of Search ............ 361/234, 230, 233, 225, 361/144, 145, 207, 225, 235, 437; 307/130; 250/492.2

[56] References Cited

U.S. PATENT DOCUMENTS

| | | | |
|---|---|---|---|
| 3,197,682 | 7/1965 | Klass | 317/262 |
| 3,634,740 | 1/1972 | Stevko | 317/262 E |
| 3,916,270 | 10/1975 | Wachtler et al. | 317/262 |
| 3,983,401 | 9/1976 | Livesay | 250/492 A |
| 4,184,188 | 1/1980 | Briglia | 361/264 |
| 4,384,918 | 5/1983 | Abe | 156/643 |
| 4,412,133 | 10/1983 | Eckes et al. | 250/492.2 |
| 4,480,284 | 10/1984 | Tojo et al. | 361/234 |
| 4,502,094 | 2/1985 | Lewin et al. | 361/234 |
| 4,520,421 | 5/1985 | Sakitani et al. | 361/234 |
| 4,551,192 | 11/1985 | DiMilia et al. | 156/345 |
| 4,554,611 | 11/1985 | Lewin | 361/234 |
| 5,117,121 | 5/1992 | Watanabe et al. | 307/130 |

FOREIGN PATENT DOCUMENTS

| | | |
|---|---|---|
| 59-079545 | 5/1984 | Japan . |
| 59-127847 | 7/1984 | Japan . |
| 60-110133 | 6/1985 | Japan . |
| 1-185176 | 7/1989 | Japan . |
| 1-313954 | 12/1989 | Japan . |
| 3-211753 | 9/1991 | Japan . |

Primary Examiner—A. D. Pellinen
Assistant Examiner—Aditya Krishnan
Attorney, Agent, or Firm—Morrison & Foerster

[57] ABSTRACT

The present invention relates in particular to electrostatic holding devices for holding semiconductor wafers and other materials during processing operations, such as vacuum sputtering, for example.

One problem with such holding devices is that a residual electrostatic charge tends to build up on the surface of the device. This can lead to problems in the release of the wafer when processing is completed, as this electrostatic charge will tend to grip the wafer.

The present invention overcomes this problem by determining a value of drive voltage to be applied to the electrostatic chuck to cancel out the holding effects of at least most of the residual electrostatic charge and thus enable release of the wafer. The value of drive voltage to be applied to allow release is determined by monitoring motion of the wafer as the drive voltage is varied, the motion of the wafer being indicative of whether it is being gripped by the body or not.

26 Claims, 7 Drawing Sheets

WAFER POSITION DETECTION

ELECTROSTATIC CHUCK WITH IMPROVED RELEASE

The present invention relates generally to the field of materials handling and in particular to electrostatic holding devices for the holding of semiconductor wafers and other materials in operations such as vacuum sputtering and other operations associated therewith (e.g., transport of the wafers to the etching station). The invention also relates to a method of holding a semiconductor wafer or other material electrostatically in such operations and associated operations.

The semiconductor industry requires clamping and transport of crystalline wafers inside various processing machines. The wafers are intricately patterned on one face and can be damaged by contact on that face. In addition, contact on the wafer sides can result in chipping which not only could result in dirt particles on the patterned surface, but also in wafer breakage at a later time. Thus many rear-contact wafer transport methods have been developed (e.g., see P H Singer, "The Role of Wafer Transport in Front-End Automation", Semiconductor International, August 1983, pp 69-65) but none of them allow motion of the wafer away from a horizontal plane due to their reliance on gravity and friction forces.

Applications which require wafer clamping in vacuo, such as ion implantation or dry etching at high rates, have relied on mechanical clamps or electrostatic forces to counteract the cooling gas pressure applied at the wafer rear surface.

Electrostatic methods of holding semiconductor wafers have been under study for many years due to the ability of electrostatic clamps to operate without contacting the delicate front surface of patterned semiconductor wafers. Examples of such uses, relevant for background information only, may be found in:

W R Livesay, "Method and Apparatus for Target Support in Electron Projection Systems", U.S. Pat. No. 3,983,401 Sep. 28, 1976

Y Sakitani, Y Minamikawa, "Specimen Supporting Device", U.S. Pat. No. 4,520,421 May 28, 1985

N Abe, "Method and Apparatus for Dry Etching and Electrostatic Chucking Device used therein", U.S. Pat. No. 4,384,918 May 24, 1983

H Ooshio, "Elctrostatic Chuck", Japanese Pat. JP117493/84, European Pat. application 85109514.1 filed Jul. 29, 1985, EP 0 171 011 A2; Japanese Pat. 61-2609490, 19 Nov. 1986

A P Neukermans, G J Siddall, J W Franklin, "Chuck", UK Patent Application GB2 149 697 A, Application No. 8427544 filed 31 Oct. 1984; and U.S. pat. application Ser. No. 547,811, 1 Nov. 1983

U Bergner, "Electro-static Chuck", UK Patent Application GB 2 050 064 A, Application No. 8013726, filed 25 Apr. 1980

T Tojo, I Mori, S Sano, "Electrostatic Chuck Plate", U.S. Pat. No. 4,480,284, Oct. 30, 1984

I H Lewin, M J Plummer, R Ward, "Electrostatic Chuck", U.S. Pat. No. 4,502,094 Feb. 26, 1985

W A Eckes, R H Rhoades, J W Vorreiter, J C Wiesner, C E Shepard, "Electrostatic Cassette", U.S. Pat. No. 4,412,133 Oct. 25, 1983.

However charge transfer to the front (gripping) surface of such electrostatic devices has caused many problems, and resulted in many attempted solutions. Charges develop on the front surface of gripping devices with such a polarity as to partially negate the gripping action. Such charges remain after removal of the applied gripping potentials, and may be reduced by mechanically wiping the gripping surface with a grounded object, or exposing it to an ioniser, after removal of the gripped object.

One of the first publications on the use of electrostatics mentioning the charge transfer problem was that of George A Wardly, "Electrostatic Wafer Chuck for Electron Beam Microfabrication", in Rev. Sci. Instrum., Vol. 44, No. 10, October 1973, pp 1506-1509. In this paper a mica insulator separated silicon wafers from the attracting backing electrode. Charge transfer to the front surface of the mica insulator was measured in vacuum and various atmospheres, and quantified in terms of the distance the wafer was pulled down to the mica surface. It was found that an oscillating drive voltage was necessary to obtain full-strength pull-down (i.e., to combat charge transfer to the gripping surface of the device), the required frequency of oscillation rising with the natural conductivity of the ambient gas. Such an oscillating drive voltage induces current flows in the wafer due to capacitive charging effects, and the square waveform employed by Wardly results in especially high transient currents at waveform transitions. These currents develop voltages inside the silicon wafer which are capable of destroying devices on the wafer.

If a less abrupt waveform (e.g., a sine wave) is employed, the resulting wafer vibration under undamped conditions may result in weakening and shattering of the crystalline wafer, especially a wafer with a slight edge imperfection. It also results in brief periods every half-cycle when the wafer is not held, and so is able to move under the influence of other forces such as gas pressure, centrifugal forces and inertia/gravity.

Other workers have occasionally claimed charge leakage to be an advantage, due to the retention of force even when the applied voltage is removed:

V Di Milia, J R Maldonado, J L Speidell, J M Warisumont, "Electrostatic or Vacuum Pinchuck formed with Microcircuit Lithography", U.S. Pat. No. 4,551,192 Nov. 5, 1985

I H Lewin, "Electrostatic Chuck Loading" U.S. Pat. No. 4,554,611 Nov. 19, 1985.

However most workers find that charge retention slows the operation of equipment down to unacceptable levels, and that mechanical removal of wafers from a retentive surface exposes wafers to unwanted shock, breakage, and particle formation hazards.

Various alternating-voltage methods have been used to dissipate charge formed on the front insulator surface of an electrostatic device; examples of work in the patent literature including ac excitation devices apart from the Wardly work cited above are:

Japanese Pat. 60-110133, 15 Jun. 1985

Japanese Pat. 61-270046, 29 Nov. 1986

C M Horwitz, S Boronkay "Electrostatic Chuck using ac Field Execution", Australian Pat. Application PI 1766, filed 6 May 1987; and PCT/AU88/00133.

Such ac field excitation can reduce the value of surface charge to a low value, but the speed of such reduction is limited both by the rate of surface charge movement, and by the rate at which voltages can be changed on the rear of the wafer without inducing excessive voltages on the delicate wafer front surface. In general such limits result in about a 2 to 4 second release time. This is slow in relation to the required speed of typical robotic handling devices. In addition a slight residual force may be evident due to an inability to obtain a quick discharge of the front surface during release cycles employing low-frequency ac excitation. Such a residual force may cause a wafer to slide off a holder in an unpredictable direction, at an unpredictable time. It may also contribute to wafer breakages if the wafer is mechanically forced away from the electrostatic holder.

There is therefore need for an improved method and device for facilitating release of a wafer or other material being held electrostatically, the device and method being such as to be able to strongly hold the wafer or other material when required.

From a first aspect, the present invention provides a method of facilitating release of a body which is electrostatically held to a holding device by a residual electrostatic charge, comprising the step of applying a voltage to the holding device such as to negate the holding effects on the body of the residual electrostatic charge.

The holding device preferably has an electrode to which a drive voltage can be applied in order to create a holding force at a surface of the holding device, in order to hold a body, which may be a semiconductor wafer, for example, thereto.

The method of the present invention preferably comprises the steps of determining the value of a drive voltage needed to be applied to the electrode in order to negate the effects of any residual charge holding the body to the holding device, and then applying that drive voltage in order to release the body.

This value of drive voltage is preferably determined by monitoring motion of the body being held, the motion tending to vary as the drive voltage varies. This variation in motion can be used to determine the optimum drive voltage to be applied to the electrode for release of the body. Once this optimum drive voltage has been determined, it may be applied to the electrode in order to enable release of the body.

In a first preferred embodiment, a voltage signal is applied to the electrode which causes motion of the body, the motion varying with the drive voltage applied to the electrode. When the motion of the body exhibits a minimum level at the fundamental frequency (first harmonic) of the voltage signal, or a maximum of second harmonic motion, this is the optimum time for release of the body, and the drive voltage at that time is the optimum release voltage (negating most of the residual voltage on the device due to reversal of the motion with respect to the voltage signal). This point of phase reversal can be determined in order to determine the release point.

In a second embodiment, body motion due to its flexure under grip forces is monitored as drive voltage is decreased towards release of the body. As the drive voltage is decreased there will come a point where release occurs and the body moves. The drive voltage can subsequently be returned to this release voltage value in order to release the body.

In each case, the drive voltage applied to hold the body is preferably a dc drive voltage. The polarity of the dc drive voltage is preferably reversed after each "holding cycle", i.e., after a body has been held for processing and then released, the dc drive voltage is reversed for the next body to be held. This prevents build up of residual charge on the holding device over a period of time.

The present invention further provides a method of electrostatically gripping and releasing a body by an electrostatic holding device, comprising the steps of applying a drive voltage to an electrode mounted in the holding device in order to grip the body, monitoring motion of the body as the drive voltage is varied in order to determine a value of the drive voltage which allows for release of the body, and bringing the drive voltage to that value in order to enable release of the body.

In a first preferred embodiment, as discussed above in relation to the first aspect of the invention, a voltage signal is superimposed on the drive voltage in order to cause an oscillating motion of the body. This motion is monitored as the drive voltage is varied and the point at which minimum motion occurs, corresponding to the phase reversal of the motion with respect to the voltage signal, is the point at which release of the body is enabled.

In a further preferred embodiment, as discussed above in relation to the first aspect of the invention, no voltage is applied to cause oscillation but the drive voltage value at which the body is released is determined by monitoring the motion of the body as the drive voltage is varied, and this drive voltage is the voltage at which release is enabled.

The body is preferably a semiconductor wafer which is to be processed by ion bombardment, or sputtering etc., in vacuum, for example, and therefore requires to be held in vacuum on a mounting device, e.g., "electrostatic chuck".

The drive voltage applied is preferably a dc voltage, whose polarity is reversed after each "holding cycle", in order to prevent build up of residual charge over a period of time.

The present invention yet further provides apparatus for holding a body electrostatically, comprising a holding device having a surface for contacting the body, an electrode and means for applying a drive voltage to the electrode in order to electrostatically grip the body to the surface, and means for determining a value of drive voltage to be applied to the electrode in order to enable release of the body.

The means for determining preferably comprises means for monitoring motion of the body as the drive voltage is varied.

In one preferred embodiment, means is provided for applying a voltage signal over the drive voltage in order to cause oscillating motion of the body. This motion is monitored as the drive voltage is varied, at the point at which minimum fundamental (first harmonic) motion occurs, corresponding to the point of phase reversal of the motion with respect to the voltage signal, is the point at which release of the body is enabled. The drive voltage can thus be brought to this point in order to enable release of the body.

In another preferred embodiment, the drive voltage at which the body is released is determined by monitoring the motion of the body, and the drive voltage may be brought to this value in order to enable release of the body. This embodiment does not require a voltage signal to be superimposed on the drive voltage to cause motion.

The surface of the holding device and/or the body are preferably shaped in order to facilitate motion of the body as the drive voltage is varied. Where the body is a semiconductor wafer, either the wafer may have some residual curvature and/or the surface of the holding device may be ridged so that at some points the wafer is not in contact with the surface. Application of the drive voltage causes deformation of the wafer, as the wafer is gripped and released. Application of a voltage signal causes some oscillating vibration of the wafer.

For example, the surface may be surrounded by a ridge or step on which the edges of the wafer rest, deformation occurring when the wafer is gripped towards the rest of the holding device surface.

Care is taken that deformation and oscillation of the wafer are not so great as to cause faults or cracks in the wafer.

Two "gripping" electrodes are preferably provided in the holding device proximate the gripping surface, but separated therefrom by an insulating layer. Drive voltages of opposite polarities are applied to each electrode.

A further reference electrode is also preferably provided to provide a reference potential for the holding device.

The present invention further provides a method of monitoring motion of a body being gripped electrostatically by a holding device, comprising the steps of applying a voltage signal to an electrode in the holding device, receiving a return signal coupled through the body and an electrode in the holding device, and processing a return signal to provide indication of motion of the body.

The signal is preferably a radio frequency signal.

From yet a further aspect the present invention provides apparatus for monitoring motion of a body being gripped electrostatically, comprising a holding device having a surface for gripping the body, first and second gripping electrodes and means for applying a drive voltage to each electrode in order to grip the body, means for applying a voltage signal to the first electrode, means for receiving a return signal coupled through the body and the second electrode, and means for processing the return signal to provide an indication of motion of the body.

The voltage signal is preferably a radio frequency signal.

An advantage of the present invention is that it allows for complete release of a semiconductor wafer which has been held for processing by electrostatic means, by determining a value of drive voltage to negate at least most of the residual charge on the holding device which would otherwise tend to grip the wafer.

A further advantage is that the invention allows for increased operating speed of electrostatic gripping devices, while retaining protection for the circuits on the surface of semiconductor wafers. The ability of the invention to utilise a dc drive voltage which is slowly varying during grip and release of the wafer means that transient currents which could cause breakdown in the circuits of the semiconductor wafers are minimised, unlike with the ac drive currents of some of the prior art methods.

A further advantage is that sequential gripping cycles do not exhibit reduced gripping action, because the dc drive voltage is preferably reversed for each cycle.

Features and advantages of the present invention will become apparent from the following description of embodiments thereof, by way of example only, with reference to the accompanying drawings, in which.

Figure 1:
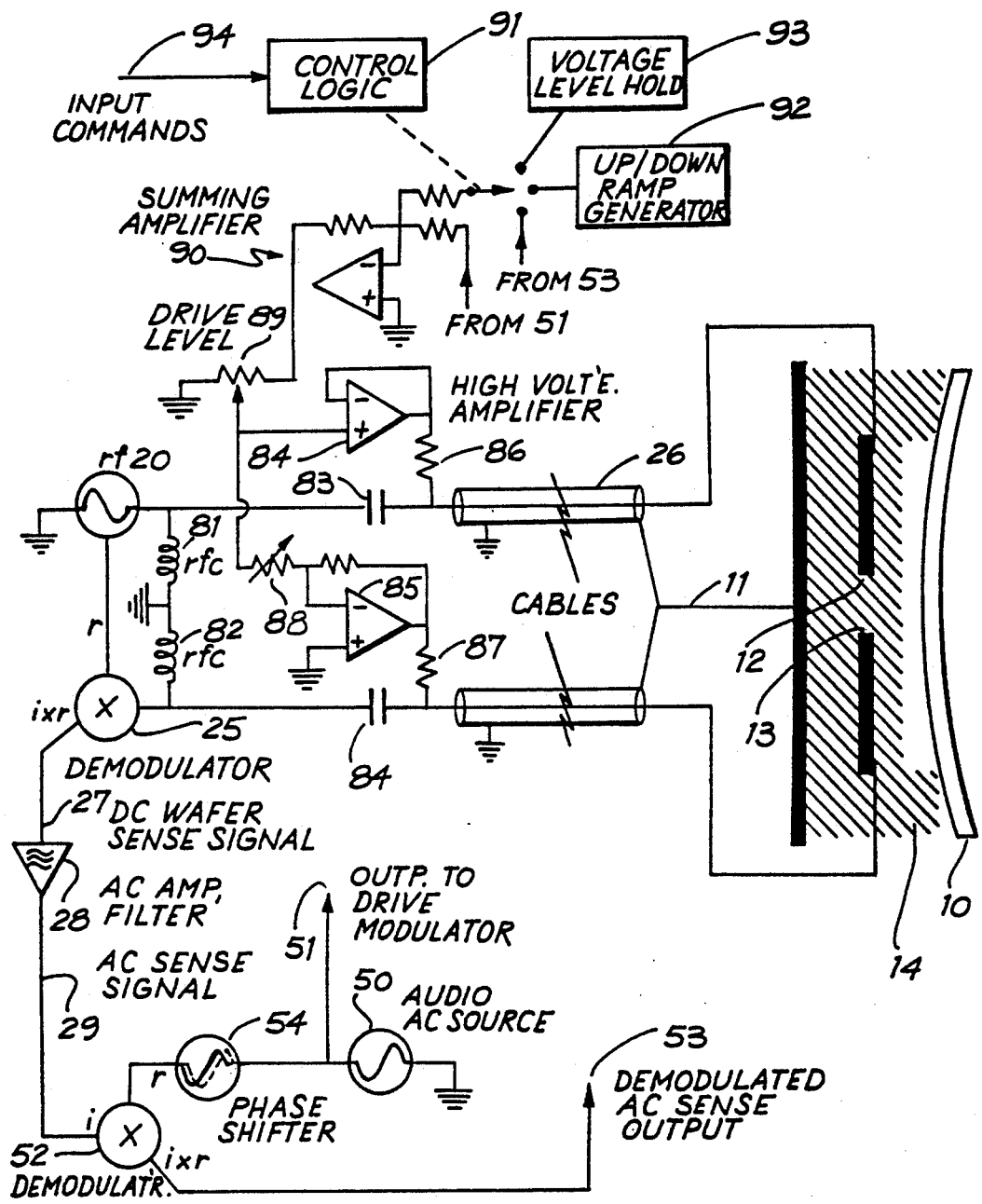
FIG. 1 shows a schematic diagram of a holding device and circuitry therefor in accordance with the first embodiment of the present invention, for performing a method in accordance with the present invention.
Figure 2:
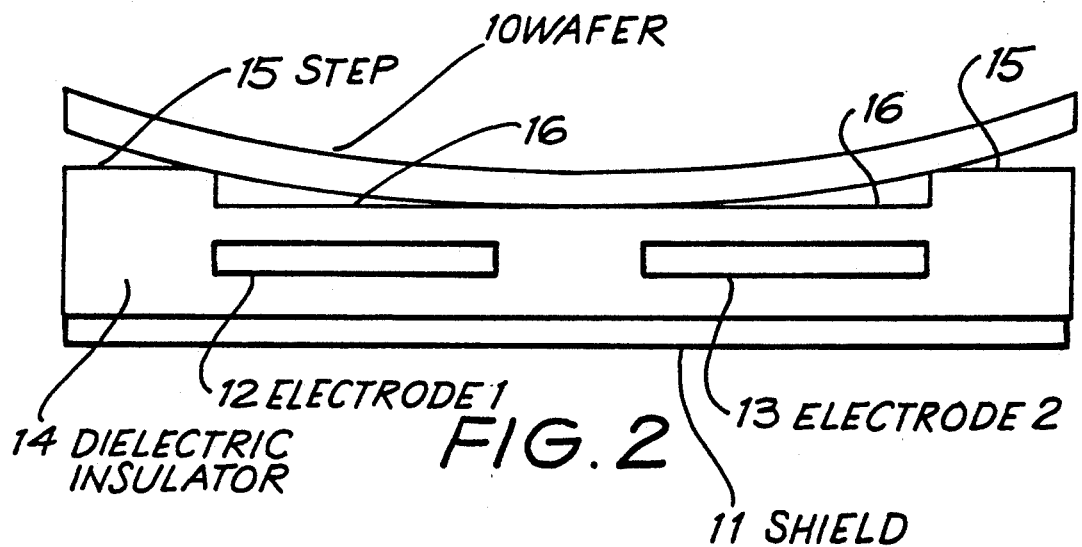
FIG. 2 is a cross-sectional schematic diagram through the chuck illustrated in FIG. 1 showing the electrode arrangement.

With reference to FIGS. 1 and 2, an overall description of the device and method in accordance with an embodiment of the present invention will be given in the following.

An electrostatic chuck for supporting a semiconductor wafer while it is being processed (for example, ion bombardment in vacuum) comprises an insulative body 14 (which may be of quartz), mounting drive electrodes 12 and 13 and shield or reference electrode 11. In FIGS. 1 and 2, the chuck is shown in cross sectional profile. It will be understood that the chuck can be any desired shape. Preferably, it is disc-like in shape to match the general shape of semiconductor wafers.

A ridge or step 15 may be formed around the outside top surface 16 of the chuck. When a drive voltage is applied to the electrodes 12 and 13, a semiconductor wafer 10 proximate the chuck is gripped towards the surface 16 of the chuck. The gripping action in concert with the ridge 15 causes deformation of the wafer as it is pulled towards the surface 16, as illustrated in FIGS. 1 and 2. The chuck and ridge 15 are dimensioned such that the deformation to the wafer 10 is not such as to cause undue stress on the wafer 10.

Note that semiconductor wafer generally have an inherent bow, which means that the chuck surface may be flat while still allowing for motion of the wafer in accordance with the present invention. The chuck surface may therefore be flat as opposed to having the "step" shown in FIG. 2.

The shield electrode 11, which can be connected to ground or to a source of wafer processing energy such as a radio-frequency power generator, acts as a reference electrode and permits coupling of energy to the wafer if desired. The wafer 10 tends to stay at the same voltage as the shield electrode 11 if the drive voltages on grip electrodes 12, 13 are balanced with respect to the shield electrode (see our own earlier published patent application PCT/AU88/00133).

When processing semi-conductor wafer, often ions are accelerated to the surface of wafers held on the chuck by passing of current through the wafer and into the plasma discharge. In such a case the rf appears on the electrostatic drive electrodes and it is necessary to protect the drive electronics from being overheated by the rf, with filter networks. However, in the past conduction of rf through the electrodes by contacting one of them and using capacitive coupling through to the other one has been so difficult that most of the electrostatic chucks tried in the industry have used only one electrostatic drive electrode. The shield electrode 11, in the embodiment described herein, may have rf connected thereto. This rear electrode is in equal contact (capacitively) with both of the drive electrodes, which in turn are equally contacting with the wafer, resulting in uniform application of the rf signal across the wafer surface.

As discussed in the preamble, during processing of the semiconductor wafer 10 being held by a chuck such as shown in FIGS. 1 and 2, residual charge due to the electrostatic force applied by electrodes 12 and 13 can build up on the surface 16 of the chuck. Charge transfer may occur via the gases used in the space between the chuck and the semiconductor wafer and also may occur via the insulative material 14. In prior art chucks, when the drive voltage is removed from the electrodes any residual charge on the surface 16 can interfere with removal of wafer 10. This creates processing difficulties. In the present invention, a value of drive voltage is determined which may be applied to electrodes 12 and 13 to allow removal of the wafer 10 without interference whether or not there is any residual charge build up on the surface 16. The amount of drive voltage will be enough to negate at least the majority of residual charge build up. When the electrodes 12 and 13 are held at this drive voltage, wafer 10 can easily be removed.

The determination of drive voltage necessary to enable removal of the wafer 10 is preferably made in the present invention by monitoring motion of the wafer 10 and from that motion determining when the drive voltage reaches the "release point".

The shape of the chuck of the present invention, i.e., the provision of the step 15, enables motion of the wafer 10 to occur in response to variation in the drive voltage. Note that it is possible that the wafer may be of a certain shape to enable deformation rather than the chuck being of a certain shape. A number of variations are possible, not just the one shown in the figures.

The chuck may also be of various shapes other than the "stepped" shape shown in the figures. The only qualification is that the shape chosen must allow for the required relative motion of the body (e.g., wafer) and chuck. As mentioned above, the chuck may even be flat where the body has an inherent bow.

Referring to FIG. 1, drive voltage is applied from ramp generator 92 via summing amplifier 90 and amplifiers 84 and 85 to cables 26 and electrodes 12 and 13.

Motion sensing is carried out by circuitry including rf generator 20, cables 26, electrodes 12 and 13, demodulator 25 and ac amplifier 28. The dc sense signal 27 may be used to monitor wafer motion for the second embodiment of the invention. The ac sense signal 29 provided by this circuitry provides an indication of motion of the wafer 10, and is demodulated by demodulator 52, whose other input is from phase shifter 54, to provide a demodulated ac sense output 53 which indicates the phase of wafer motion relative to the phase of the generator 50.

In the embodiment of FIG. 1, an oscillating voltage 51 from ac source 50 is superimposed on the drive voltage in order to cause oscillation of the wafer 10. Oscillation of the wafer 10 is monitored by the position sensing circuitry to produce a demodulated ac sense output 53 in accordance with the oscillation. As the main drive voltage is varied, a point will be reached where the wafer is released, and this point can be determined by monitoring the demodulated ac sense output 53.

The circuitry of FIG. 1 will be described in more detail later.

In the following, specific parts of circuitry and their respective functions will be described in detail, as well as the method for obtaining release of the wafer using the circuitry.

Electrodes 12 and 13 are typically energised at equal and opposite voltages, as described in Horwitz, Boronkay document mentioned earlier (PCT/AU88/00133), except that the voltage applied in this case is dc whereas the voltage applied in that case was an ac voltage. Such excitation maintains the wafer potential at about the same potential as that of shield electrode 11. This is normally desired in wafer handling operations, but is not an essential component of the release process described here.

Figure 3:
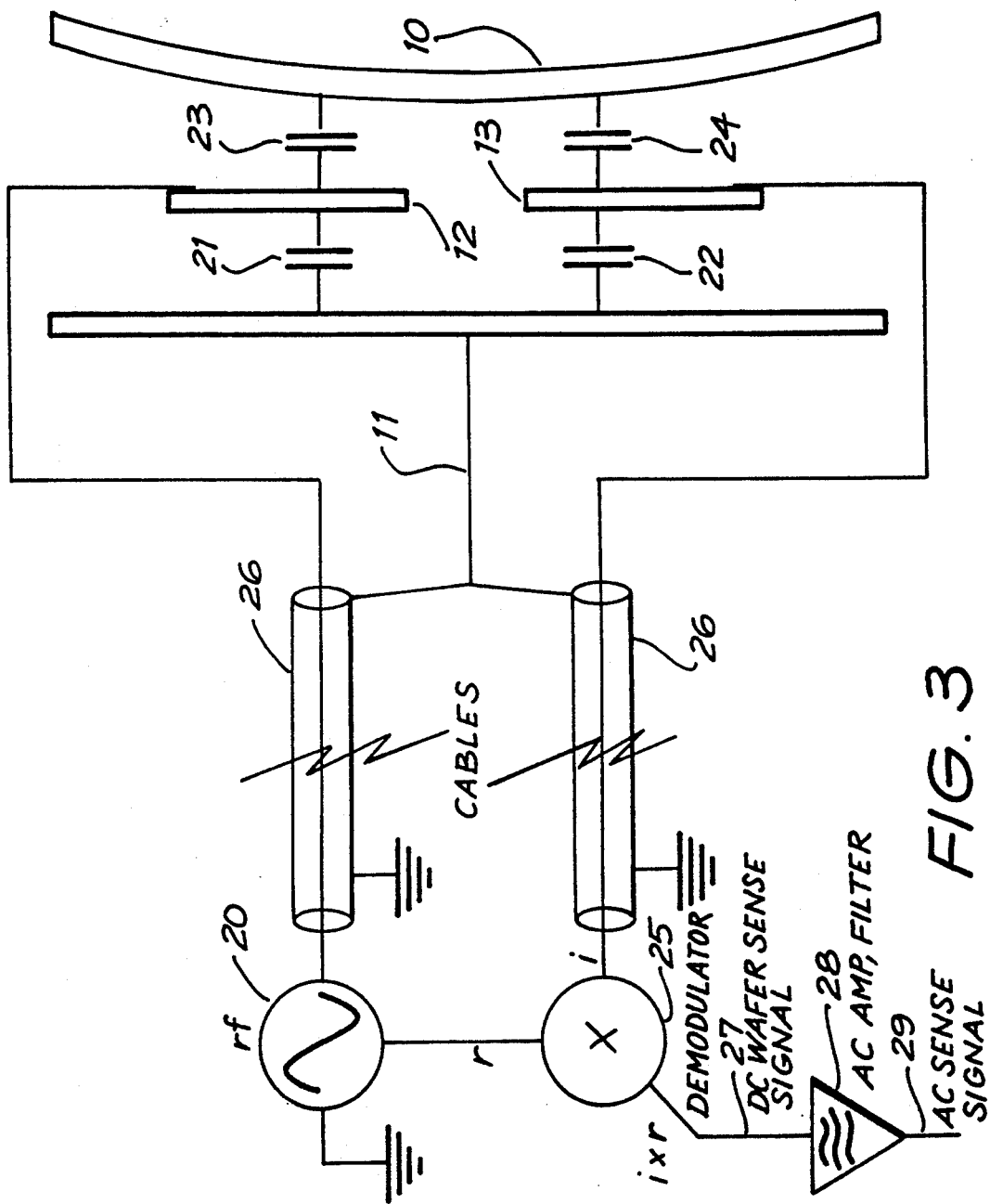
FIG. 3 is a schematic circuit diagram showing the position detecting circuitry of FIG. 1 in simplified form.

FIG. 3 shows a schematic detail of the wafer position sensing circuitry of FIG. 1 used for sensing motion of the wafer 10 as a result of variation in the drive voltage applied to electrodes 12 and 13. A radio frequency signal in the MegaHertz range, for example about 8 MHz, is produced by radio frequency generator 20. Generator 20 supplies this rf signal both as a "reference" to a double-balanced modulator phase detector 25, and to the electrode 12 via cable 26. Signal pickup from electrode 13 is transmitted through cable 26 to the phase detector "signal" input.

Figure 4:
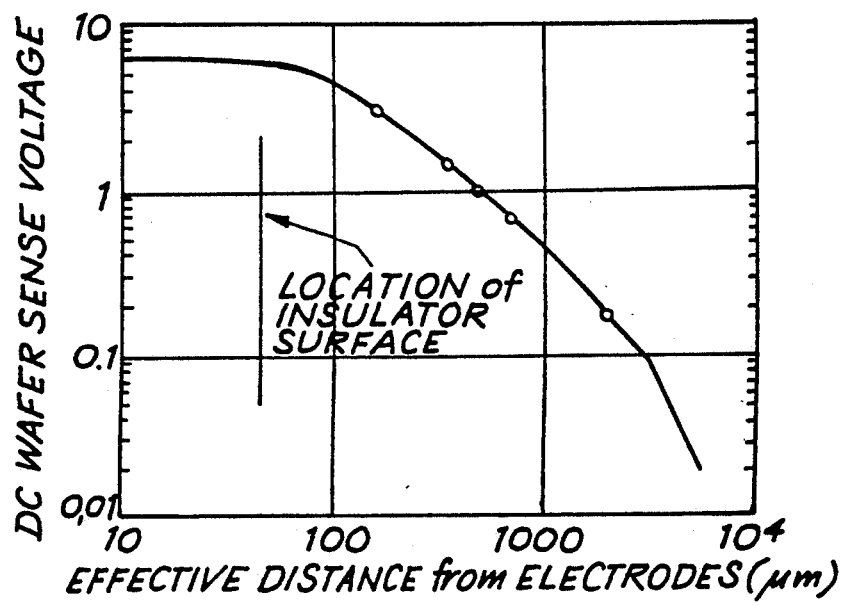
FIG. 4 is a graph of "dc wafer sense voltage" against "effective distance from electrodes", for illustrating the position detection method in accordance with the present invention.

The output dc level 27 provides a measure of wafer position relative to the gripping surface, as indicated in FIG. 4. This figure shows a plot of output dc level versus the effective distance from the electrodes to the wafer. This effective distance is the total effective air distance, obtained by summing the air gap distance and the insulator thickness divided by its dielectric constant. At distances smaller than the insulator thickness (curve region at upper left hand side), the mechanical testing equipment compressed resulting in curve saturation. A sensitivity of 40 mV/$\mu$m is demonstrated in this plot close to the gripping surface, and a useful range of up to 3 mm is available with circuits which are sensitive to small changes from the "zero" signal position.

The signal pickup on electrode 13 is derived from coupling of signals from electrode 12 through capacitances 23 and 24, and the wafer 10, to electrode 13. Such coupling is proportional to the capacitances 23 and 24, hence to the inverse of the spacing between wafer and electrodes. As can be seen from FIG. 4, such an inverse relation is obtained in the central region of the plot. Both the amplitude of the signal on electrode 13, and (often more importantly) its phase, vary with the position of the wafer 10. Further processing of the dc signal 27 with ac amplifiers and filters 28 yields an ac signal 29 with a sensitivity to wafer motion of 40 mV/$\mu$m. This ac signal is used in the release process.

A phase adjustment circuit (not shown) for the "r" signal is also preferably included in between rf generator 20 and demodulator 25. This permits adjustment of wafer position sensing sensitivity to an optimum (i.e., high sensitivity) level, by setting of the phase of the reference signal to maximise demodulated output 27 with a wafer present on the clamping surface. This phase setting would typically be done only at first setup of the system.

Figure 5:
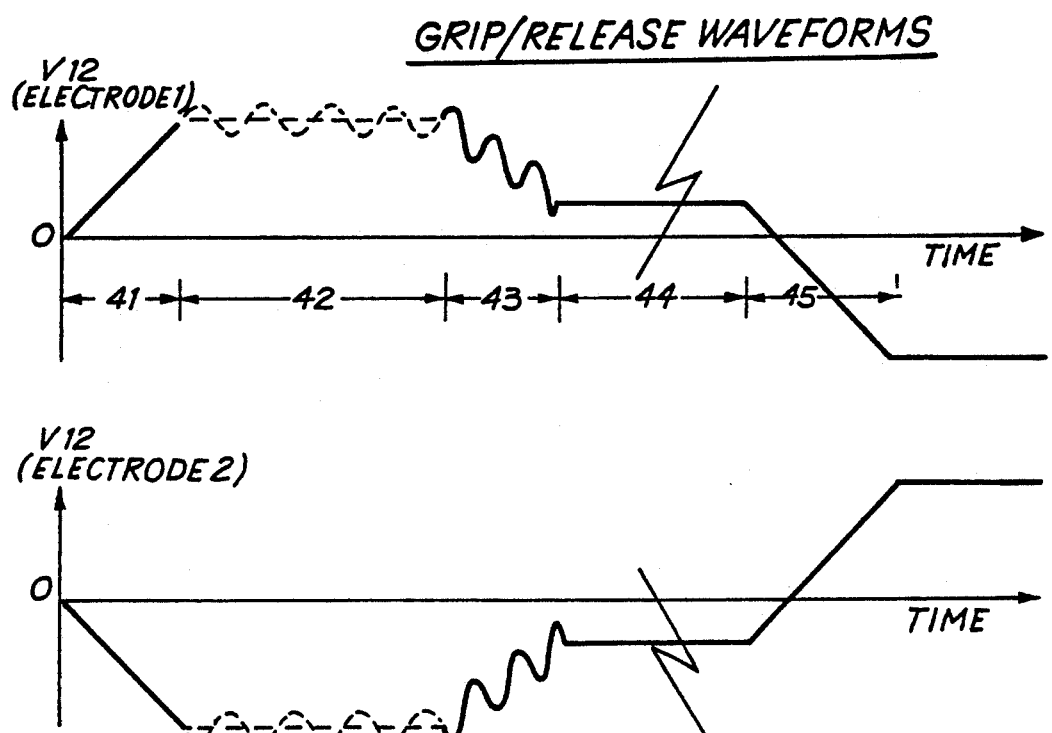
FIG. 5 shows grip/release waveforms for the drive voltage of the circuitry of FIG. 1.

The drive voltage is applied to electrodes 12 and 13 in accordance with the circuitry of FIG. 1 as illustrated by grip/release waveforms in FIG. 5.

Electrodes 12 and 13 are driven in antiphase, so it suffices to consider only one set of waveforms. Starting from zero applied voltage, wafers are gripped through the application of high voltage during the period 41. Such voltage is applied gradually to minimise capacitive current flow and so keep voltage stresses inside the wafer low. During period 42 the wafer may be held with or without oscillating voltage modulation of the drive voltage. Oscillating the drive voltage causes motion of the wafer which can be used to determine the release point, as discussed above. It is only essential to provide this oscillating voltage signal towards the end of the grip cycle, although providing it before is useful for calibration of the phase comparison circuitry (see later). Such oscillation is shown dotted in the period 42 to indicate its optional nature. If modulation is present the wafer will flex at the frequency of the modulation waveform, which is in the audio frequency range between about 1 Hz and 20 kHz, but would typically be between 30 Hz and 200 Hz to obtain maximum flexing and hence operating sensitivity, with a given wafer and operating environment.

Release is obtained while modulating the drive waveform and reducing the average drive level, as shown for period 43. Operation in this period is discussed in the following paragraphs. In period 44 the drive voltage need not be modulated, and is held fixed at the release point where outside electric fields due to charges on the regions 16 are cancelled by the field generated by electrodes 12 and 13. No force is exerted on any body put near the gripping surface in this mode. In period 45 a second gripping cycle is initiated; it will be noted that the drive polarity is reversed on the electrodes, so that repeated gripping cycles will not cause a unidirectional buildup of charge that would eventually prevent gripping action.

Figure 6:
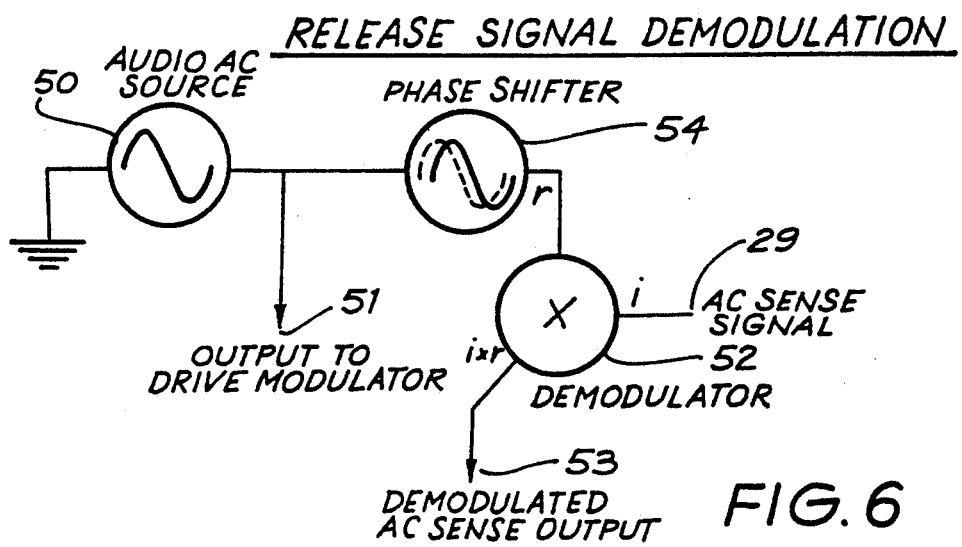
FIG. 6 is a schematic diagram of demodulation circuitry of FIG. 1, for demodulating the position sense signal.

During grip period 42 and release period 43 the wafer movements caused by low-frequency modulation of the drive signal result in an ac output 29 from the wafer position sense circuitry. A demodulated form of this ac output is required, and could be obtained by sampling techniques combined with computer control of signal generation, phasing, and signal processing. However the principle is shown in FIG. 6 for an analogue implementation. FIG. 6 shows a schematic detail of the release signal demodulation circuitry of FIG. 1. The ac signal 51 from modulation generator 50 is superimposed upon the electrode drive signal in order to cause oscillating movement of wafer 10, as discussed above. In addition the generator signal is coupled through a phase shifting network 54 to the reference port of a demodulator 52. The ac wafer position sense output 29 is applied to the signal input port of the demodulator, resulting in an output 53 proportional to the amount of signal 29 which is in phase with the reference signal. The phasing 54 is adjusted to obtain a maximum signal level at the output 53 during the grip period 42 (this is why it is useful to apply the signal 50 during period 42). Upon reducing the electrode drive voltage in period 43, output 53 executes the behaviour shown in FIG. 7. Initially the wafer is strongly clamped at high drive voltage, resulting in a low level of wafer vibration 60. As the drive voltage is reduced, wafer vibrations increase to a maximum level at point 61. As the drive voltage passes through the "release point" 62, wafer motion is at a minimum level at the fundamental frequency of modulation, since any voltage deviation from the release point voltage results in increased attraction of the wafer to the gripping surface, resulting in wafer motion according to the second harmonic of the ac modulation waveform 51. Further reduction of the average drive level results in opposite-phase vibration of the wafer at the fundamental frequency of the generator 50, rising to a maximum level 63 then falling as gripping forces are increased with falling average drive level 64.

Figure 7:
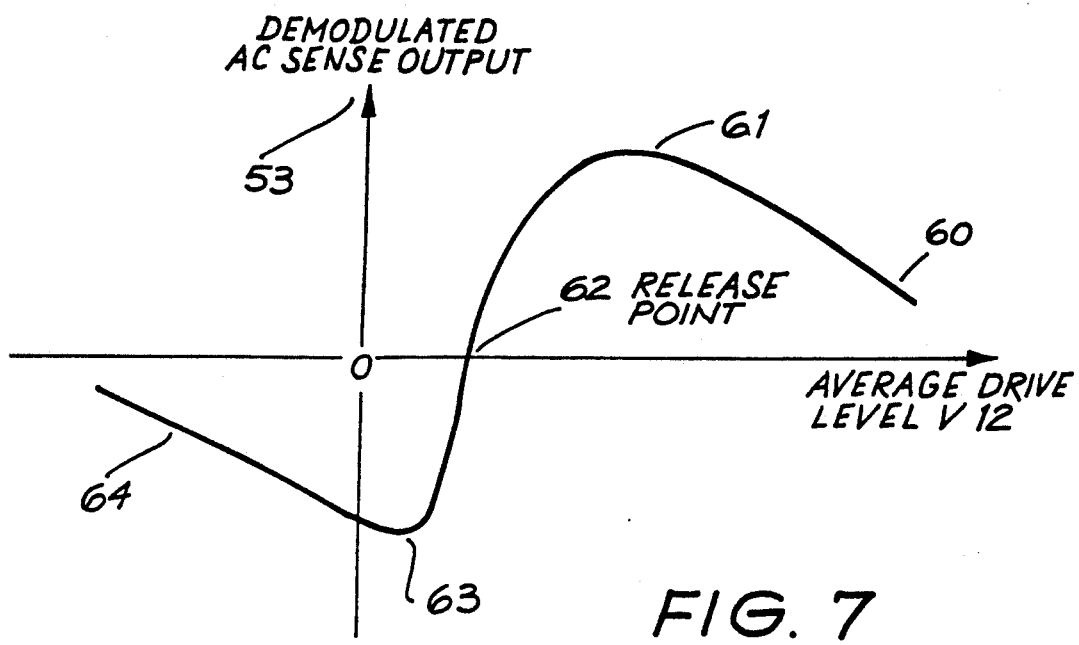
FIG. 7 is a graph of "demodulated ac sense output" against "average drive value" for illustrating the method of finding the release point for release of the electrostatically held body.

The bipolar output 53 shown in FIG. 7 permits many methods of automatically reaching and remaining at the release point; for example linear amplifier feedback, sample-and-hold, and computer control are techniques which may be used alone or in combination to achieve fast wafer release.

The circuitry of FIG. 1, embodiment 1, will now be described in more detail.

The wafer 10 is shown held in a representative electrostatic assembly which permits the wafer to move as excitation voltage on the electrodes 12 and 13 is varied. Wafer position (and motion) detection is performed using rf excitation and demodulation as earlier described; in this case the rf is coupled into the electrode excitation cables through filter capacitors 83 and 84 which present a small impedance to the rf signal but a relatively large impedance to the main driving and wafer position oscillation driving voltages. Conversely the radio frequency chokes 81 and 82 present a small impedance to the driving and waver movement voltages, but a large impedance to the rf signals. This decoupling avoids adverse interactions between the different circuit portions.

The main driving signals which induce wafer gripping and position oscillation are fed through further decoupling resistors 86 and 86 from the high voltage amplifiers 84 and 95, which are each capable of bipolar output voltage drive. Amplifier 85 is configured to provide an output of opposite polarity to that of amplifier 84, and its output level is adjusted with control 88 to provide a balanced drive such that the voltages induced on the wafer 10 are at a minimum. This adjustment is performed using a basically sinusoidal ac "balance test" signal to the input of the amplifiers (this balance test signal is provided by the up/down ramp generator 92).

Signals to the output amplifier circuits are obtained through a drive level control 89 from a summing amplifier 90. This amplifier can take signals from both the wafer position oscillation generator 50, and the wafer gripping and releasing generators 92 and 93, under the control of logic 91 which is instructed by user input commands 94. Oscillator 50 need not be on all of the time, but may be turned off until it is time to release the wafer.

In operation from the startup condition, the input of amplifier 90 would be connected to the ramp generator 92 which would provide a zero output signal. If a wafer were present, the wafer sense dc signal 27 would indicate that. Upon an input command to grip this wafer, the control logic would command the ramp generator to commence gripping the wafer by increasing the drive voltage in one direction. High and opposite voltages would then be applied to electrodes 12 and 13. During the gripping period, oscillation from generator 50 may be added to the drive signals in order to set the correct phasing of the phase shifter 54, obtaining a maximum signal 53 at the output of demodulator 52. Generator 50 may then be turned off until the release time.

Upon a command 94 to release the wafer, the control logic would turn on generator 50 and commence a decrease of gripping voltage. Generator 92 may initially commence ramping the drive voltage down to some preset lower level. However the release process is completed by using signal 53 to control the drive level at the output of amplifier 90 such that signal 53 is held at zero, just at the point at which its polarity changes. The input to the summing amplifier is then held at that point by a "voltage level hold" circuit 93 until the next gripping cycle. The electrode voltage is held by circuit 93 at a level where the average electric field from the electrodes substantially cancels the average surface charge electric fields emanating from the gripping surface. If there is a long period between wafer gripping cycles, this held voltage level need not be maintained; charges on the wafer gripping surface would then be able to leak away.

Minimisation of the voltages on the surface of the wafer which are induced by electrode drive voltages is accomplished by balancing drive voltages on electrodes 12 and 13. If the electrodes are coupled equally to the wafer 10 (i.e., if the electrode areas and insulator thicknesses for both electrodes are identical under the wafer), then equal and opposite voltages on the electrodes would result in zero wafer voltage. However in practice irregularities in relative electrode—wafer coupling and circuit accuracy result in a need to balance the circuit using control 88 in order to keep induced wafer voltages low. Such balancing is performed by driving amplifier 90 (hence the amplifiers 84 and 85) with a steady ac signal in a "balancing test"0 mode. The voltage on a dummy wafer on the wafer gripping surface is monitored and control 88 adjusted to minimise this voltage. The system is then balanced and ready for use.

Figure 8:
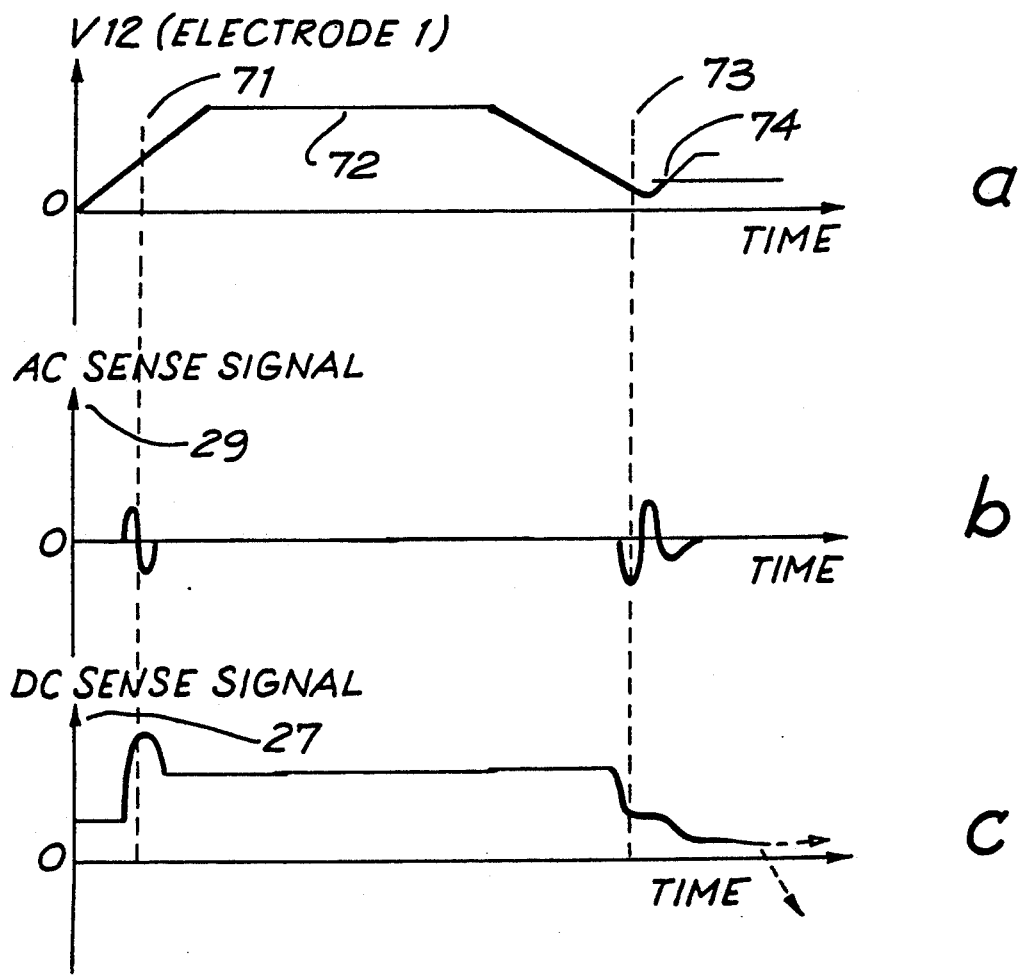
FIG. 8 shows grip/release waveform for a second embodiment of the invention.

FIG. 8 illustrates grip/release waveforms for a second embodiment of the invention which does not utilise phase detection of motion of the wafer 10.

In this second form of the invention, a simple monotonically-varying drive waveform as shown in FIG. 8 is employed. The upper portion of FIG. 8 (FIG. 8(a)) shows one of the electrode drive voltages; the other electrode drive voltage is omitted for clarity but would commonly be proportional to the inverse of the waveform shown. During initial gripping of the wafer, the ac sensing output 29 (FIG. 8(b)) may exhibit a transient due to the wafer being partly and momentarily released from the grip surface, and so more lightly deformed, at point 71. However, subsequently the wafer will be held with high gripping forces in period 72. The wafer is thus held under relatively high stress during the grip period 72. Upon release initiation the drive level is reduced, and a transient 73 in signal 29 is observed, of opposite shape to the initial transient 71. This transient corresponds to the wafer being released and then gripped again by passing through the "release point" at 73. Such a combined releasing and gripping action results in wafer flexure due to the spring restoring action of the wafer. The drive voltage is then returned to the release voltage at 74 to complete the release.

The dc sense signal 27 may also be used to determine the wafer release point, as shown in FIG. 8(c). The signal exhibits minima corresponding to zeros of the ac sense signal 29. Upon release, the dc signal is at a minimum corresponding to a maximum distance between wafer and chuck, and at that point the dc signal may jump off scale if the wafer is allowed to fall off.

Control of voltages as described above may be obtained using sample-and-hold or computer techniques, but has to account for time delays in the electronics (both in the measurement of the drive level via feedback circuits, and in the wafer position sensing circuitry). Such time delays would otherwise result in inaccurate detection of the release point voltage. One method is to ramp past the detected release point as shown in FIG. 8 in two directions, thus bracketing the release point. Further ramps at slower rates may be used to determine the release point more accurately.

A preferred method is to ramp down fast, going past the release point. This fixes a lower level of drive voltage, above which is the release point. Then we ramp up slower, past the release point, fixing an upper boundary on the position of the release point drive voltage. Thus the release point is bracketed between two drive voltage levels.

For subsequent operations a fixed error size in release level is determined; when ramping in drive voltage around the probable release position results in sufficiently small dc sense signal changes, release in determined by ramping back to the most probable drive voltage for release and holding there.

Subsequent ramps are of alternating direction and progressively slower, until release is obtained to sufficient accuracy. An alternative method is the "golden search" which is used if release takes too long using successive ramps. Such golden search methods are well known in the computing literature, and can provide an optimal search strategy once the upper and lower search bounds are well defined in the first two ramps, and once an error size is determined which will permit search termination.

Figure 9:
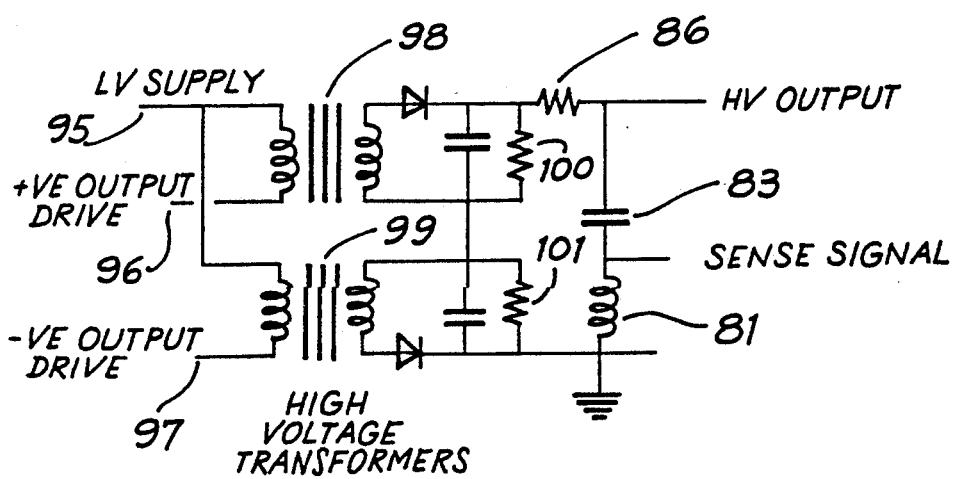
FIG. 9 shows a schematic circuit diagram of an output portion of one of the high voltage amplifiers 84, 85 of FIG. 1.

An output portion of one of the high voltage amplifiers, 84 or 85, is illustrated in more detail in FIG. 9. It is generally difficult to obtain an output stage for bipolar high voltage drive, and this circuit operates to achieve this. Surrounding the circuit (not shown) are oscillating drivers and feedback operational amplifiers to ensure a linear response at the output to input signals from amplifier 90. Persons skilled in the art would have the knowledge to design such circuitry.

The low voltage available from the electrostatic drive circuitry power supply 95 is typically of the order of 30 volts. Each electrode in the gripping unit must be driven in a linear and bipolar fashion over a range of approximately plus or minus 10 kilovolts, at rates of about 10 Hz for large signal swings. Transient output currents are required to charge the electrode capacitances, but high levels of output current are not required. This performance is simply and economically attained using back to back high voltage generating supplies, one for positive and one for negative output voltage swings. Oscillating drive voltage 96 applied to the positive output transformer 98 results, after rectification and filtering in network 100 in a positive output appearing through resistor 86 at the output. This output is in series with the negative output filtering network 101, and current flow is permitted through the filter network resistor, which must be capable of passing any currents required at an acceptable voltage drop. Negative output voltages are obtained by application of drive voltage 97, while removing the positive drive 96. Resistor 86 and the filter capacitor 83 combine further to filter the output voltage, while (in concert with coil 81) isolating wafer position sense signals from the high voltage circuit.

Figure 10:
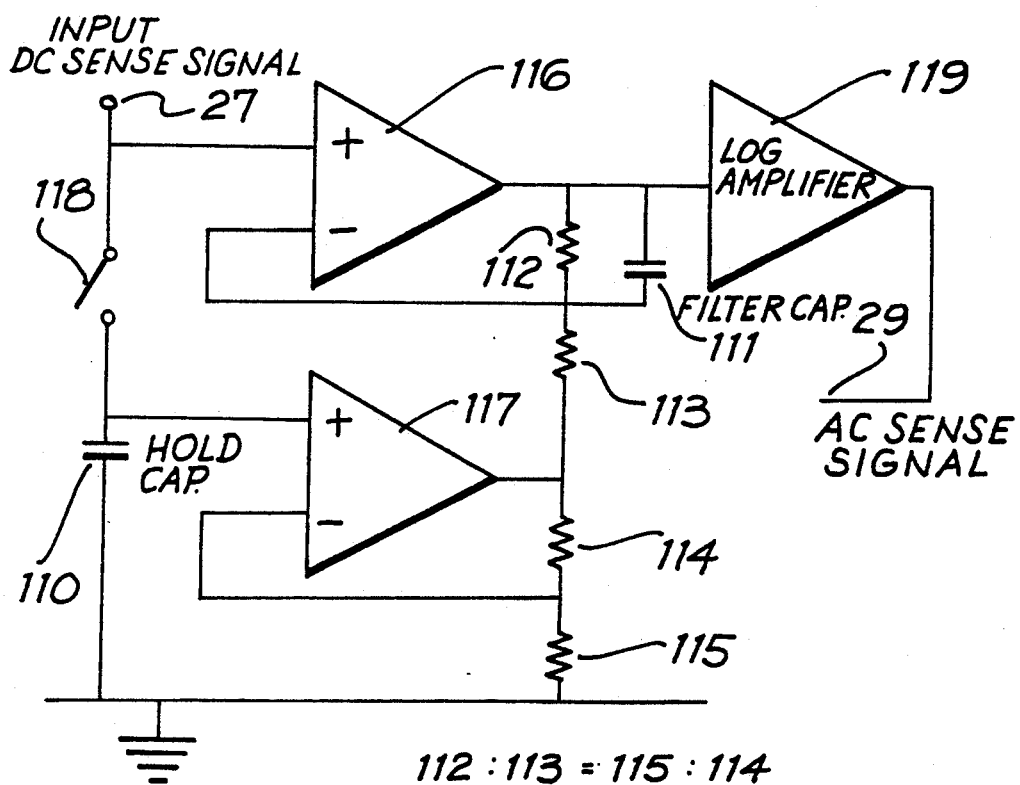
FIG. 10 shows a more detailed schematic circuit diagram of the ac amplifier 28 of FIG. 1.

FIG. 10 is a more detailed schematic circuit diagram of a preferred arrangement for the amplifier 28 of FIG. 1, for amplifying the dc wafer motion sense signal 27.

The arrangement utilizes autozeroing dc amplifier following the demodulator 25, forming an ac amplifier 28 with good transient perfomance. The dc amplifier is zeroed to the signal level 27 present just before wafer release, and then amplifies signal changes relative to that starting point during the release cycle. With reference to FIG. 10, switch 118 is held closed during the grip period with the result that amplifiers 116 and 117 have the same input voltage. The resistor ratio of values 112:113 is chosen to be equal to the ratio 115:114, resulting in roughly zero output from amplifier 116. This translates into roughly zero output from the nonlinear (e.g., logarithmic) amplifier 119. Upon commencement of the release cycle, switch 118 is opened, causing capacitor 110 to retain the value of dc signal 27 just before release. Thereafter, the output of amplifiers 116 and 119 reflect the deviation of signal 27 from its pre-release value. Capacitor 111 filters this output to remove extraneous noise from the signal applied to the nonlinear amplifier 119. Amplifier 119 is configured such that small output signals from amplifier 116 are amplified with high gain, and such that as the signals from 116 increase, the gain of 119 falls. This enables operation over a wide dynamic range of input signal levels without saturation at high signals or loss of sensitivity for low signals, permitting a wide range of conditions between the clamping surface and wafer to be tolerated without needing adjustments in circuit gain or zero level.

Note that it is possible that, in the present invention, motion of the wafer could be caused by other means than an applied voltage, for example mechanical means (particularly in the first embodiment described herein.)

The present invention is also not limited to use with semiconductor wafers and processing thereof. It is possible that it could be utilised in the handling of other materials which are held by electrostatic means and where buildup of charge is a problem.

Although the present invention has been described in relation to an electrostatic chuck for holding a semiconductor wafer while it is being processed, it is quite possible that it could be used for other devices, such as the paddles which are used to transport semiconductor wafers (see our earlier application, PCT/AU88/00133).

Further, although a dc drive voltage (whose polarity is reversed after each "holding cycle") is used with the particular embodiments described, it is possible that an ac drive voltage could be applied instead. For example, an ac drive voltage would then form the dominant signal, and a small dc drive voltage would be applied when the wafer was released; this dc voltage being arrived at by monitoring the wafer movement as before while increasing the dc voltage and decreasing the ac voltage level. At some dc voltage point the wafer ac first-harmonic position would null to zero and then the ac gripping voltage could be reduced all the way to zero to let go of the wafer fully.

It will be appreciated by persons skilled in the art that numerous variations and/or modifications may be made to the invention as shown in the specific embodiments without departing from the spirit or scope of the invention as broadly described. The present embodiments are, therefore, to be considered in all respects as illustrative and not restrictive.

I claim:

1. A method for releasing a body which is held electrostatically to a holding device by a holding effect of a residual electrostatic charge, the method comprising the steps of:
    applying a drive voltage to the holding device, the drive voltage causing a motion of the body;
    varying the drive voltage;
    monitoring the motion of the body by monitoring a feedback signal which varies as a function of the motion of the body as the drive voltage is varied, thereby determining a release voltage, the release voltage being a value of the drive voltage at which the feedback signal signifies that the holding effect of the residual electrostatic charge is substantially eliminated; and
    applying the release voltage to the holding device.

2. A method in accordance with claim 1, wherein the motion of the body is monitored by monitoring an electrical feedback signal.

3. A method in accordance with claim 1, wherein the response of the body is monitored by monitoring an electrical feedback signal is fed back from the holding device, the electrical feedback signal being indicative of the motion of the body.

4. A method in accordance with claim 1, wherein a perturbation force is applied to the body to cause a perturbation of the motion of the body and elimination of the holding effect of the electrostatic charge is determined by monitoring the effect of the perturbation force on the motion of the body.

5. A method in accordance with claim 4, wherein the perturbation force is applied by superimposing a pertubation signal on the drive voltage.

6. A method in accordance with claim 1, wherein the holding device is an electrostatic chuck for holding the body in various processing operations, and the body is a semiconductor wafer or other material.

7. A method for electrostatically gripping a body with an electrostatic holding device and subsequently releasing the body, the method comprising the steps of:
    applying a drive voltage to an electrode mounted in the holding device in order to grip the body;
    monitoring an indication of motion of the body as the drive voltage is varied in order to determine a value of the drive voltage corresponding to a release voltage which allows for release of the body; and
    bringing the drive voltage to the release voltage in order to enable release of the body.

8. A method in accordance with claim 7, wherein the step of monitoring the indication of motion of the body comprises the steps of:
    applying a signal to the electrode, said signal being coupled through the electrode and body and returned as a fed back position sense signal, and
    detecting said fed back position sense signal, whereby said fed back signal provides an indication of the motion of the body.

9. A method in accordance with claim 8, wherein said fed back position signal is demodulated to produce a wafer position sense signal, and the wafer position sense signal is amplified and further demodulated to provide a position sense output.

10. A method in accordance with claim 8, wherein said signal is a radio-frequency signal.

11. A method in accordance with claim 9, wherein the step of monitoring the indication of motion of the body as the drive voltage is varied comprises the step of comparing the phase of the indication of motion of the body with the phase of the position sense signal.

12. A method in accordance with claim 7, further comprising the step of causing motion of the body by modulating the drive voltage with a predetermined signal.

13. A method in accordance with claim 12, further comprising the step of applying a further signal to the electrode, the further signal being coupled through the electrode and the body and fed back as a position sense signal, and wherein the step of monitoring an indication of motion of the body as the drive voltage is varied comprises the step of determining the phase of the position sense signal relative to the predetermined signal.

14. A method in accordance with claim 8, wherein the step of monitoring an indication of motion of the body as the drive voltage is varied comprises the steps of:
   monitoring the position sense signal as the drive voltage is varied; and
   setting the release voltage substantially equal to the value of the drive voltage which causes a minimum gripping force to be exerted on the body.

15. Apparatus in accordance with claim 14, wherein the surface of the holding device is shaped to facilitate motion of the body.

16. A method for monitoring motion of a body being gripped electrostatically by a holding device, the method comprising the steps of:
   applying a voltage signal to an electrode in the holding device;
   receiving a return signal coupled through the body and an electrode in the holding device; and
   processing the return signal to indicate motion of the body.

17. Apparats for holding a body electrostatically, comprising:
   a holding device having a surface for contacting the body;
   an electrode adjacent the surface;
   means for applying a drive voltage to the electrode in order to grip the body electrostatically to the surface; and
   means for determining a value of a drive voltage to be applied to the electrode in order to enable release of the body, wherein the means for determining comprises a means for monitoring an indication of motion of the body as the drive voltage is varied.

18. Apparatus in accordance with claim 17, wherein the means for monitoring motion comprises:
   means for applying a signal to the electrode;
   means for detecting a return signal coupled through the holding device, the body, and the electrode; and
   means for processing the return signal to produce a body position sense signal.

19. Apparatus in accordance with claim 18, further comprising means for causing motion of the body by a predetermined modulating signal to the drive voltage.

20. Apparatus in accordance with claim 19, wherein the means for determining further comprises means for comparing the phase of the body position sense signal and phase of the predetermined modulating signal.

21. Apparatus in accordance with claim 17, wherein the means for determining further comprises means for determining the value of the drive voltage which causes a minimum gripping force to be exerted on the body as the drive voltage is varied.

22. Apparatus for monitoring motion of a body being gripped electrostatically, comprising:
   a holding device having a surface for gripping the body;
   first and second gripping electrodes;
   means for applying drive voltages to the first electrode and the second electrode in order to grip the body;
   means for applying a voltage signal to the first electrode;
   means for receiving a return signal coupled through the body and the second electrode; and
   means for processing the return signal to provide an indication of motion of the body.

23. Apparatus for monitoring an indication of the location of a body being gripped, comprising:
   first and second gripping electrodes;
   means for applying drive voltages to the first electrode and the second electrode in order to grip the body;
   means for applying a voltage signal to the first electrode;
   means for receiving a return signal coupled through the body and the second electrode; and
   means for processing the return signal utilizing phase-sensitive detection to indicate the location of the body.

24. Apparatus in accordance with claim 23, comprising means for further processing the return signal in order to provide a signal indicative of motion of the body.

25. Apparatus in accordance with claim 24, comprising means for processing the signal indicative of motion of the body, including a non-linear amplifier.

26. Apparatus in accordance with claim 25, wherein the non-linear amplifier is arranged to provide an amplification which is relatively large for an input signal level which is small, and which amplification decreases as the signal input level increases.

* * * * *